United States Patent [19]

Tsui et al.

[11] Patent Number: 5,248,370
[45] Date of Patent: Sep. 28, 1993

[54] APPARATUS FOR HEATING AND COOLING SEMICONDUCTOR WAFERS IN SEMICONDUCTOR WAFER PROCESSING EQUIPMENT

[75] Inventors: Chiu-Wing Tsui, Santa Clara; Richard H. Crockett, San Jose, both of Calif.

[73] Assignee: Applied Materials, Inc., Santa Clara, Calif.

[21] Appl. No.: 789,394

[22] Filed: Nov. 7, 1991

Related U.S. Application Data

[60] Continuation of Ser. No. 619,268, Nov. 28, 1990, abandoned, which is a division of Ser. No. 348,527, May 8, 1989, abandoned.

[51] Int. Cl.$^5$ .............................................. H01L 21/00
[52] U.S. Cl. ............................ 156/345; 118/724; 118/723 I; 156/643; 204/298.09; 204/298.33
[58] Field of Search .................... 118/724, 725, 723; 156/345, 643; 204/298.09, 298.03

[56] References Cited

U.S. PATENT DOCUMENTS

| | | | |
|---|---|---|---|
| 4,261,762 | 4/1981 | King | 118/728 |
| 4,392,915 | 7/1983 | Zajac | 156/345 |
| 4,466,872 | 8/1984 | Einbinder | 118/715 |
| 4,508,161 | 4/1985 | Holden | 118/724 |
| 4,527,620 | 7/1985 | Pedersen et al. | 118/728 |
| 4,565,601 | 1/1986 | Kakehi et al. | 156/345 |
| 4,615,755 | 10/1986 | Tracey et al. | 156/626 |
| 4,743,570 | 5/1988 | Lamont | 427/38 |
| 4,963,713 | 10/1990 | Horiuchi | 156/345 |
| 4,980,022 | 12/1990 | Fujimura et al. | 156/345 |

FOREIGN PATENT DOCUMENTS

| | | | |
|---|---|---|---|
| 59-220915 | 4/1985 | Japan | 204/298.09 |
| 61-039519 | 2/1986 | Japan . | |
| 62-252943 | 11/1987 | Japan . | |
| 63-141317 | 6/1988 | Japan . | |
| 02137664 | 10/1984 | United Kingdom | 204/298.09 |

OTHER PUBLICATIONS

IBM Technical Disclosure; "Cooling Ion-Implanted Target"; vol. 19, No. 6, 1976, pp. 2270-2271.
Nuclear Instruments And Methods; "Experiments on Gas Cooling of Wafers"; King et al., 189 (1981), 169-173.
European Search Report.

Primary Examiner—Brian E. Hearn
Assistant Examiner—George Goudrean
Attorney, Agent, or Firm—Birgit E. Morris

[57] ABSTRACT

A method for heating or cooling a semiconductor wafer in semiconductor processing apparatus is described which comprises directing into contact with a surface of the wafer at least a portion of one or more components of the process gas to transfer heat between the wafer and a wafer support positioned in the apparatus adjacent to the wafer. Method and apparatus are also described for controlling the total flow of process gas through the apparatus and for monitoring the pressure in said apparatus to maintain the desired pressure therein.

7 Claims, 2 Drawing Sheets

5,248,370

APPARATUS FOR HEATING AND COOLING SEMICONDUCTOR WAFERS IN SEMICONDUCTOR WAFER PROCESSING EQUIPMENT

This is a continuation of U.S. application Ser. No. 07/619,268 filed Nov. 28, 1990, now abandoned, which is a division of U.S. application Ser. No. 07/348,527 filed May 8, 1989, now abandoned.

BACKGROUND OF THE INVENTION

1. Field of the Invention

This invention relates to methods and apparatus for cooling and heating semiconductor wafers during the production of integrated circuit structures. More particularly, this invention relates to wafer cooling and heating by means of a heat transfer gas.

2. Description of the Related Art

During the plasma etching of a semiconductor wafer, such as a silicon wafer, it is desirable to cool the wafer to avoid excessive heat buildup which can interfere with the processing. For example, excess heat can cause reticulation of the photoresist resulting in reduced sensitivity of the process. Other integrated circuit production processes such as Chemical Vapor Deposition (CVD) require that the wafer be heated to support the proper chemical deposition reactions.

Wafer cooling is conventionally accomplished using a silicone rubber heat transfer pad which is mounted between the wafer and a pedestal and which functions as a wafer support and heat sink. However, it has been found that the transfer of heat from wafer to the pedestal heat sink via the silicone rubber pad is not always sufficient to dissipate the amount of heat generated during the plasma etching process. Tests and analysis indicate that the primary heat transfer mechanism is due to thermal conduction of gas rather than due to contact conduction from the wafer to the pedestal through the silicone rubber pad.

The use of gas as a thermal conductor in semiconductor wafer process is known for transmitting heat either to or from a wafer. For example, King U.S. Pat. No. 4,261,762 discloses a method for cooling a wafer being bombarded by ions in an ion implantation apparatus wherein a wafer is clamped adjacent its periphery to a target block and a cooling gas with a high thermal conductivity such as nitrogen, neon, helium, or hydrogen is fed under pressure into the space between the wafer and the cooling block through an orifice in the cooling block.

Lamont U.S. Pat. Nos. 4,680,061 and 4,743,570 describe the use of a gas to conduct heat to or from a wafer from a heat exchange means which may comprise a heater for heating the wafer or a heat sink for cooling the wafer. A pressure plate seals the periphery of a wafer carrier plate assembly against the wall of a vacuum apparatus while the wafer is either heated or cooled by the heat exchange means utilizing gas conduction heat transfer by introducing a fraction of the argon gas employed for operation of the sputter deposition source directly into the space between the heat exchange means and the wafer.

However, these prior uses of a gas as a heat transfer conductor have been limited to use of the gas in a separate chamber or compartment of the apparatus isolated from the portion of the process apparatus generating the heat, e.g., the sputter deposition chamber, either because a different gas was used for the heat transfer than the gas used in the process, or because it is desired to maintain a higher vacuum in the main process apparatus than that of the cooling chamber. To maintain this separation and pressure differential, the wafer is usually clamped and/or sealed to provide this higher pressure on the backside of the wafer.

For example, in the aforementioned King patent, the pressure or vacuum in the ion implantation process chamber is said to be $7 \times 10^{-7}$ Torr while the pressure behind the wafer is said to vary from 0.5 to 2.0 Torr. In the aforementioned Lamont patent the argon gas is said to be admitted into the heating station at pressures of 100 to 1000 microns, which pressures are stated to be one to two orders of magnitude higher than the normal argon pressure of 10 microns in the main chamber.

While it has been thought that the use of such high pressures (relative to the processing pressures) are necessary to achieve the desired heat transfer through the gas, quite surprisingly, it has been found that good heat transfer can be obtained or achieved at the same pressure or vacuum conditions used in carrying out the plasma etching process, thus making unnecessary the prior art practice of using high pressures and sealing between the wafer and the processing chamber.

SUMMARY OF THE INVENTION

In accordance with the invention, it has been found that good heat transfer can be obtained or achieved at the same pressures or vacuum utilized for the plasma etching process or other semiconductor manufacturing processes by using certain gases for cooling or heating which can also function as components of the process gas.

It is, therefore, an object of the present invention to provide a process and apparatus for cooling or heating a semiconductor wafer in a semiconductor processing apparatus utilizing one or more components of the process gas as a gas conduction heat transfer gas by directing at least a portion of such one or more components of the process gas into contact with a surface of the wafer and then permitting the one or more process gas components to pass into the reaction chamber of the apparatus.

It is another object of the present invention to provide a process for cooling or heating a semiconductor wafer in an apparatus utilizing one or more components of the process gas as a gas conduction heat transfer gas by directing at least a portion of such one or more process gas components into contact with a surface of the wafer as such one or more process gas components pass into the apparatus while controlling the flow of process gas into the chamber to keep the total flow of process gas into the chamber constant and while monitoring the pressure or vacuum in the apparatus to maintain the desired pressure therein.

These and other objects of the invention will be apparent from the following description and accompanying drawings.

DETAILED DESCRIPTION OF THE PREFERRED EMBODIMENTS

An aspect of the present invention comprises a method and an apparatus for cooling a semiconductor wafer in a plasma etching apparatus utilizing one or more components of the process gas used in the plasma etching process as a gas conduction heat transfer gas by directing at least a portion of such one or more components of the process gas into contact with a surface of the wafer as such one or more process gas components pass into the plasma etching apparatus. In a preferred embodiment, the flow of process gas into the chamber is controlled to keep the total flow of process gas into the chamber constant and the pressure or vacuum in the plasma etching apparatus is monitored to maintain the desired vacuum in the plasma etching apparatus.

Figure 1:
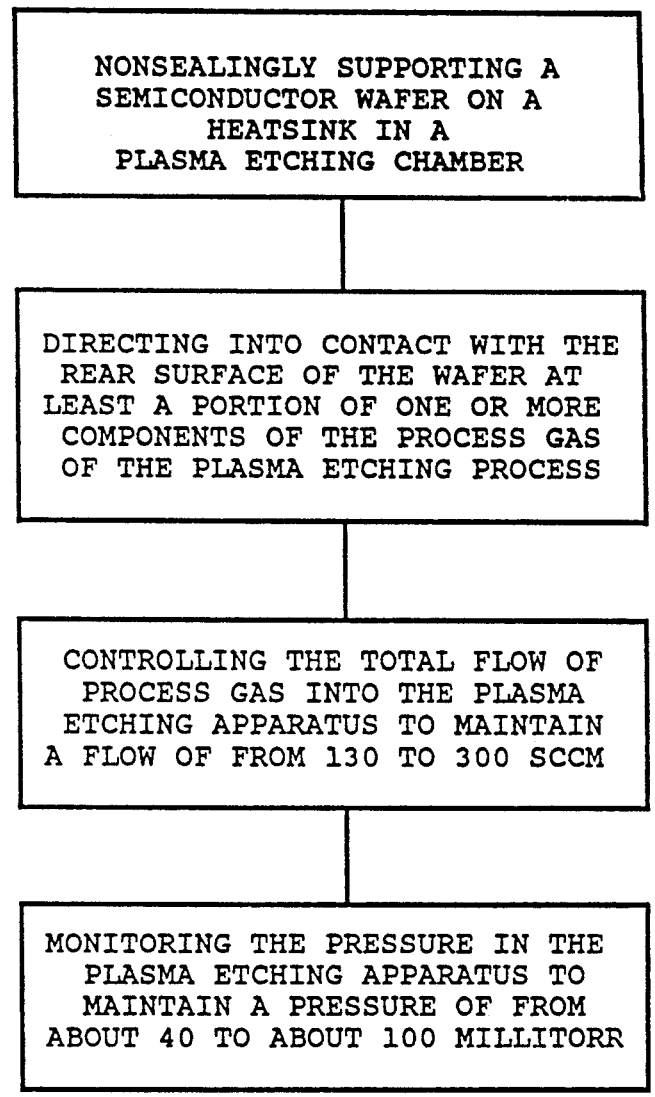
FIG. 1 is a flow sheet of the process of the invention.
Figure 2:
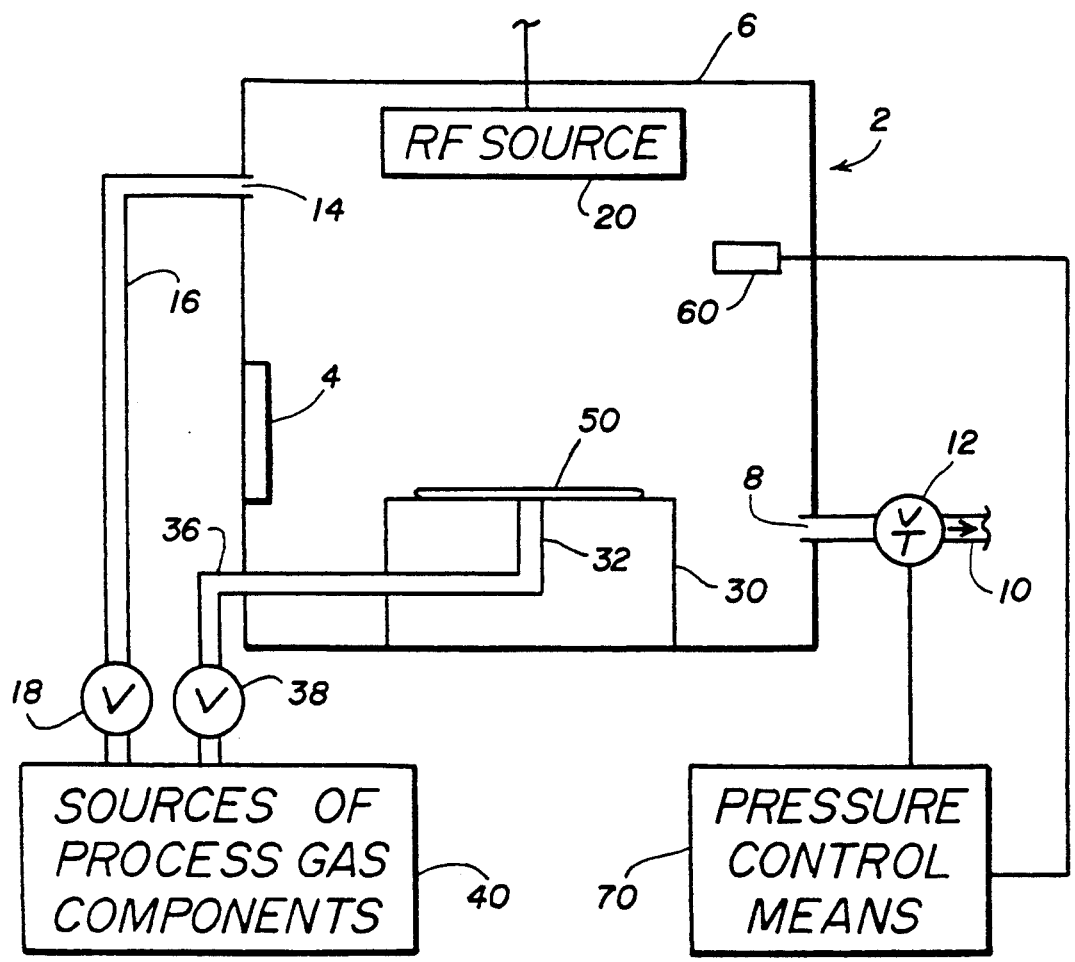
FIG. 2 is a fragmentary cross-sectional view of a portion of a plasma etching apparatus showing the admission of some of the process gas into the chamber via prior contact with the surface of the wafer and monitoring and flow control means which may be used to control the flow of process gas through the chamber to maintain the desired vacuum in the chamber.

As shown in FIG. 2, a plasma etching apparatus or chamber 2 is generally indicated comprising a chamber wall 6, an evacuation port 8 which is connected through pipe 10 and throttle valve 12 to an external pumping source (not shown) to maintain the desired vacuum in chamber 2, and at least one interlock 4 through which a wafer may be introduced into chamber 2. Within chamber 2 is an rf source 20 connected to an external power supply (not shown) to generate the plasma and a wafer support pedestal 30 upon which a wafer 50 is positioned for etching by the plasma generated by rf source 20. An inlet port 14 is also provided in chamber wall 6 for admission of process gas into plasma etching chamber 2 through pipe 16 and flow control valve 18 from an external process gas source 40.

In accordance with the invention, means are provided in wafer support pedestal 30 for the direction of at least a portion of one or more components of the process gas into contact with the rear surface of wafer 50 resting on pedestal 30 comprising, in the illustrated embodiment, a central bore 32 in pedestal 30. Central bore 32 is, in turn, connected through pipe 36 and flow control valve 38 to external process gas source 40, which may comprise one or more components of the process gas used in the plasma etching process carried out in chamber 2.

The term "process gas", as used herein, is intended to define a mixture of gases which may either function as active etching components of the process gas or as carrier gases. Examples of components usually present in such plasma etching process gases are 1-4 carbon fluorinated hydrocarbons, such as $CHF_3$, $CF_4$, and $C_2F_6$; oxygen, $NF_3$, and $SiF_4$; as well as carrier gases such as helium, nitrogen, and argon.

It should be noted, in this regard, that while process gas source 40 is shown as a single source, it will be understood that process gas source 40 may comprise individually controlled sources of each of the gases which collectively make up the process gas. Process gas source 40 may, therefore, include means to separately control the ratio of these components flowing through pipe 36 and flow control valve 38 to bore 32 and the rear surface of wafer 50 from the ratio of such gases flowing into plasma etching chamber 2 through inlet port 14.

Not all of these components of the process gas will function satisfactorily in the process of the present invention as satisfactory heat transfer agents to conduct heat from wafer 50 to pedestal 30 at the operating pressure or vacuum utilized in plasma etching apparatus 2. Therefore, the term "one or more components of the process gas" as used herein to describe the portion of the process gas which is brought into contact with the rear surface of wafer 50 through bore 32, is intended to define only those components of the process gas which will provide satisfactory heat transfer between wafer 50 and pedestal 30. Such components include argon and the aforementioned 1-4 carbon fluorinated hydrocarbons, such as $CHF_3$, $C_2F_6$, and $CF_4$.

The total amount of such process gas components which enters chamber 2 through bore 30 may be adjusted through flow control valve 38 to comprise only about 1-5%, preferably about 2% of the total amount of process gas which flows into chamber 2, with the balance flowing into chamber 2 via inlet port 14.

It should be noted that while central bore 32 is shown as the sole means for bringing such one or more components of the processing gas into contact with the rear surface of wafer 50, more than one such bore could be provided in pedestal 30 or at least the top surface of wafer support pedestal 30 could comprise a porous metal to permit exit of such processing gas components into contact with the rear surface of the wafer 50 at more than one point. In any event, it will be noted that while wafer 50 is shown resting on pedestal 30, there is no seal or clamping type retention provided between wafer 50 and pedestal 30 to try to confine or restrict the movement into plasma etching chamber 2 of molecules of the one or more components of the process gas which have been brought into contact with the rear surface of wafer 50 through bore 32 in pedestal 30. Such sealing means are unnecessary in the practice of the present invention due both to an absence of pressure differentials between chamber 2 and the rear surface of wafer 50 as well as the use of one or more heat transfer gases which are also components of the process gas used in the plasma etching process, i.e., that heat transfer gases and the plasma etching gases are both used at the same pressure and the heat transfer gases comprise a portion of the plasma etching gases.

Pressure or vacuum monitor means 60 are also provided within plasma etching chamber 2 to monitor the total gas pressure in chamber 2. A signal from gas monitor means 60 may be fed to throttle valve 12 when the pressure exceeds a predetermined amount so that chamber 2 may be further evacuated. Alternatively or supplementally, the pressure or vacuum in chamber 2 could be controlled by controlling the flow of process gas entering chamber 2 through flow control valve 18 using control means 70.

When the pressure or vacuum in chamber 2 is controlled by throttle valve 12 through control means 70, the flow of process gas through inlet valve 18 and pipe 16 from process gas source 40 may be made constant by initial adjustment of control valves 18 and 38.

Plasma etch chamber 2 is maintained at a pressure of from about 40 to 200 millitorr, preferably about 60 millitorr. The total flow of process gas into chamber 2 which is necessary to maintain the plasma in chamber 2 ranges from about 130 to about 300 sccm. Of this amount, from at least about 0.05 sccm, preferably about 0.15 sccm, flows through bore 32 in pedestal 30 with the balance entering chamber 2 through process gas inlet port 14.

It will be noted that the silicone rubber pad conventionally placed between wafer 50 and pedestal 30 has been eliminated since the pad is not needed for conduction of heat from wafer 50 and pedestal 30. Instead, pedestal 30, which may be formed of aluminum metal, may be anodized to provide from about 0.5 mils to about 2.0 mils of aluminum oxide as electrical insulation between wafer 50 and pedestal 30 without materially interfering with the heat flow from wafer 50 to pedestal 30 through the process gas molecules in accordance with the invention.

To illustrate the advantages of the invention, the temperature of a silicon wafer subjected to plasma etching in a conventional etching chamber having a silicone rubber heat transfer means was measured and found to be 115° C. after a sufficient time to achieve steady state conditions, i.e., after about 3-5 minutes of etching. In contrast, the temperature of a silicon wafer cooled in accordance with the invention and etched under the same etching conditions and time period was found to be 65° C., indicating the superior heat transfer realized using the process and apparatus of the invention.

While the above preferred embodiment refers to the cooling of semiconductor wafers in plasma etching apparatus, methods and apparatus in accordance with the present invention can also advantageously heat wafers within semiconductor processing equipment. For example, in a CVD chamber a process gas can be used as a heat transfer agent by flowing it between a heated pedestal and a wafer supported over the pedestal and then into the CVD chamber. Again, the process gas used for the heat transfer can comprise a chemically active gas, an inert or carrier gas, or combinations thereof. The process gas can also include any gas not destructive to the processing of the semiconductor wafer which accomplishes the heat transfer of the present invention. For example, the process gas could be an inert gas not otherwise used in the process but which can be released into the reaction chamber without degrading the processing of the wafer.

While this invention has been discussed in terms of a single wafer system, it is equally applicable to multiple wafer systems such as the Applied Materials 8310 etcher which processes 18 wafers simultaneously. In the case of multiple wafer etcher systems, it is still desirable to maintain the total pressure of the process gasses to the range of 130-300 sccm, and the flow of process gas against each wafer at least about 0.05 sccm. In the case of the 8310 etcher, this results in a total flow of process gasses against the wafers of at least about 0.9 sccm. The total gas flow for cooling is still in the range of 1-5% of the process gas within the apparatus.

Thus, the invention provides an improved process and apparatus for heating or cooling a semiconductor wafer in a semiconductor processing apparatus using the process gas as the heat conducting means between the wafer surface and a heat conductor. Preferably, the flow of process gas into the chamber is controlled to keep the total flow of process gas into the chamber constant and the pressure in the apparatus is monitored to maintain the desired pressure therein.

Having thus described the invention, what is claimed is:

1. Apparatus for cooling a semiconductor wafer in a plasma etching apparatus by utilizing one or more thermally conductive components of the process gas used in the plasma etching process as a gas conduction heat transfer gas which comprises:
  a) a support surface for supporting said wafer in said plasma etching apparatus, said support surface further function as a heat sink;
  b) means for directing at least a portion of said one or more thermally conductive components of said process gas into thermal contact with a rear surface of said wafer facing said support surface through one or more openings in said support surface;
said apparatus being further characterized by the absence of clamping or sealing means between said wafer and said support surface where after said one or more thermally conductive components of said process gas are directed into thermal contact with said rear surface of said wafer the gas is allowed to flow into the plasma etching chamber.

2. The apparatus of claim 1 which further comprises means for controlling the flow of process gas through said plasma etch apparatus to maintain a total flow of from about 130 to about 300 sccm of process gas through said plasma etching apparatus.

3. The apparatus of claim 1 which further comprises means for monitoring the vacuum in said plasma etching apparatus to maintain a vacuum in said plasma etching apparatus of from about 40 to about 200 millitorr.

4. The apparatus of claim 1 wherein said support surface supports a plurality of said wafers at one time and wherein a portion of said process gas is directed into thermal contact with a rear surface of each of said wafers.

5. Apparatus for heating or cooling a semiconductor wafer being processed in a semiconductor wafer processing apparatus which comprises:
  a wafer support in said chamber comprising means for supporting said semiconductor wafer in said chamber without clamping or sealing said wafer to said wafer support; and
  b) means for directing at least a portion of one or more thermally conductive components of the process gas used in the reaction chamber into thermal contact with a rear surface of said wafer facing said wafer support to change the temperature of said wafer and thereafter allowing said one or more thermally conductive components of the process gas into the reaction chamber.

6. The apparatus of claim 5 wherein said means for directing at least a portion of said one or more components of said process gas into contact with said rear surface of said wafer further comprise one or more openings in said wafer support facing said rear surface of said wafer.

7. The apparatus of claim 5 wherein a plurality of said wafer supports is present in said apparatus and wherein a portion of said process gas is directed into thermal contact with a rear surface of each of said wafers.

* * * * *